United States Patent [19]
Kumar

[11] Patent Number: 5,227,013
[45] Date of Patent: Jul. 13, 1993

[54] FORMING VIA HOLES IN A MULTILEVEL SUBSTRATE IN A SINGLE STEP

[75] Inventor: Nalin Kumar, Austin, Tex.

[73] Assignee: Microelectronics And Computer Technology Corporation, Austin, Tex.

[21] Appl. No.: 735,572

[22] Filed: Jul. 25, 1991

[51] Int. Cl.⁵ ......................... H05K 3/00; H05K 13/00
[52] U.S. Cl. .................................... 156/644; 156/655; 156/656; 156/668; 29/846; 219/121.71; 219/121.85
[58] Field of Search ............... 156/643, 644, 655, 656, 156/661.1, 668; 437/189, 192, 195, 203; 219/121.85, 121.71; 29/846

[56] References Cited

U.S. PATENT DOCUMENTS

| | | | |
|---|---|---|---|
| 4,642,160 | 2/1987 | Burgess | 156/655 X |
| 4,810,332 | 3/1989 | Pan | 204/15 |
| 4,816,323 | 3/1989 | Inoue | 428/200 |
| 4,830,706 | 5/1989 | Horwath et al. | 156/661.1 X |
| 4,840,923 | 6/1989 | Flagello et al. | 156/644 |
| 4,897,153 | 1/1990 | Cole et al. | 156/643 |
| 4,940,508 | 7/1990 | Shamouilian et al. | 156/644 X |
| 4,966,865 | 10/1990 | Welch et al. | 156/644 X |
| 4,983,250 | 1/1991 | Pan | 156/644 X |
| 5,011,580 | 4/1991 | Pan et al. | 204/15 |
| 5,118,385 | 6/1992 | Kumar et al. | 156/655 X |

OTHER PUBLICATIONS

Tessier et al., "Process Considerations in Fabricating Thin Film Multichip Modules," International Electronics Packaging Society Conference Proceedings, 1989, pp. 294–313.

Endo et al., "Material and Processing Technologies of Polyimide for Advanced Electronics Devices," Journal of the Electrochemical Society, vol. 134, No. 10 (Oct. 1987), pp. 2522–2527.

Levinson et al., "High Density Interconnections Using Laser Lithography," International Symposium of Hybrid Microelectronics, 1988 Proceedings, pp. 301–306.

*Primary Examiner*—Thi Dang
*Attorney, Agent, or Firm*—David M. Sigmond

[57] ABSTRACT

A method for forming via holes in a multilayer structure in a single step. The invention includes disposing over a base a first layer comprising first metal lines beneath a first dielectric, disposing over the first layer a second layer comprising second metal lines beneath a second dielectric such that a portion of each first metal line is not beneath any second metal line, and forming via holes which extend through the second dielectric to the second metal lines and through the second dielectric and the first dielectric to the portions of the first metal lines. Thereafter conductive metal can be deposited in the via holes. The method is particularly well suited for fabricating copper/polymer substrates.

49 Claims, 7 Drawing Sheets

FORMING VIA HOLES IN A MULTILEVEL SUBSTRATE IN A SINGLE STEP

BACKGROUND OF THE INVENTION

1. Field of the Invention

The invention relates to the fabrication of multilevel electrical interconnects, and more particularly to a method of forming via holes between the top of a dielectric layer and various levels of underlying metallization prior to filling the via holes with a conductive material.

2. Description of Related Art

Current multi-chip circuitry design requires the attachment of numerous integrated circuit chips to high density electrical interconnects, also known as high density multi-chip-modules (MCMs) or as substrates. Substrates normally include surface pads for bonding to surface mounted chips, a dielectric, and electrical lines buried in the dielectric for connecting selected pads to provide electrical routing between various bond sites on the chips. It is common to use copper for the buried lines and a polymer such as polyimide for the dielectric. The copper lines may form separate layers of orthogonal wiring sets. It then becomes necessary to interconnect the copper lines to each other and/or the surface pads. This can be done by either staggered or stacked metallization (or metal vias). Staggered via designs normally result in lower interconnect density than stacked vias. Stacked vias, such as vertical metal pillars residing in vertical via holes, may be built either additively or subtractively. Additive construction involves building up pillars over an underlying base and depositing dielectric around the pillars. The subtractive approach, to which the present invention is directed, works in the opposite direction. Via holes are formed or etched in a dielectric and metal is deposited in the via holes.

Needless to say, one of the most important factors in the viability of any high density multilayer substrate is fabrication cost. Cost is roughly determined by the number of fabrication steps. More fabrication steps typically increase labor and material costs as well as decrease yields. Thus, any mature process which reduces the number of steps required to produce an equivalent substrate is useful and valuable.

Other methods have been developed in order to efficiently form via holes in a dielectric. The main thrust has been layer-by-layer. That is, for each layer with a dielectric over metal lines, via holes are formed in that layer before the next layer is constructed. In this manner, a separate step for forming via holes becomes necessary for each layer. See Levinson et al., "High Density Interconnects Using Laser Lithography," *ISHM '88 Proc.*, 1988, pp. 301–306; and U.S. Pat. No. 4,897,153 to Cole et al. For instance, fabricating a four layer substrate (with a power plane, ground plane, X-conductors and Y-conductors) normally requires four separate steps (one for each layer) just to form the via holes. Therefore, the related art does not teach how to reduce the number of steps required to form via holes in each layer of a multilayer structure as additional layers are added.

SUMMARY OF THE INVENTION

The present invention addresses the previously described problems by providing a method of forming via holes through each layer of a multilayer structure in a single step. The present invention is described primarily in terms of copper/polymer substrates with buried conductive lines for interconnecting surface mounted integrated circuit chips. However, it is understood that the invention has more general utility, particularly for printed circuit boards, printed wiring boards, integrated circuit chips and other structures used for electrically connecting separate electronic components, or connecting separate regions of individual electronic components.

An object of the present invention is to form via holes in a multilayer structure in a single step, independent of the number of layers. The via holes can be formed individually by laser drilling, or formed concurrently by applying a dry etch through a patterned mask.

Another object of the present invention is to provide vertical metal pillars which connect metal lines in various layers of an interconnect substrate in a minimal number of process steps.

A feature in accordance with one aspect of the present invention includes disposing over a base a first layer comprising first metal lines beneath a first dielectric, disposing over the first layer a second layer comprising second metal lines beneath a second dielectric such that a portion of each first metal line is not beneath any second metal line, and forming via holes which extend through the second dielectric to the second metal lines and through the second dielectric and the first dielectric to said portions of the first metal lines.

Advantages of the present invention include the reduction of fabrication steps and costs, quick turnaround, improved yield, and improved planarization of polymer dielectrics. Furthermore, all of the process steps in the present invention have been demonstrated.

These and other objects, features and advantages of the present invention will be more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

The first step of the present invention is to construct a multi-layer structure (with at least two layers) wherein each layer contains an electrically conductive line beneath a dielectric. This can be performed by many standard techniques well known in the art. For instance, separate layers can be inexpensively formed from lamination but the dielectric constant may be high. Or a layer of copper can be deposited on a base and selectively etched, as described in U.S. Pat. No. 4,810,332 to Pan and U.S. Pat. No. 5,011,580 to Pan et al. which are incorporated by reference. This approach will now be described.

Figure 1:
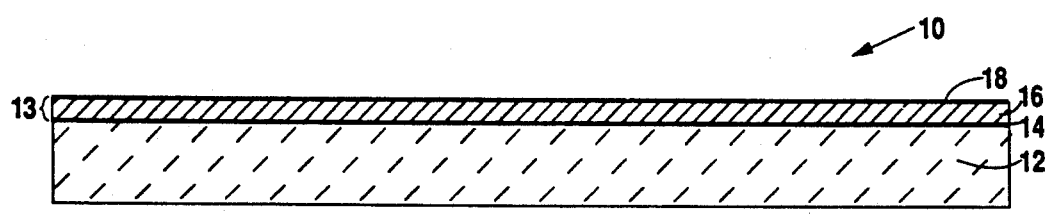
FIG. 1 shows a fragmentary elevational view in cross-section of a layer of metal on a base.

Referring now to the drawings wherein depicted elements are not necessarily shown to scale and wherein like or similar elements are designated by the same reference numeral through the several views and, more particularly to FIG. 1, there is shown a multilayer electrical interconnect substrate generally designated 10 according to a particularly preferred exemplification of the invention. Base 12 is shown as a ceramic such as alumina ceramic or glass ceramic, however, it is understood that base 12 can be a dielectric, a conductor, an electronic component (e.g., integrated circuit chip), or a preceding layer of a multilayer structure. Base 12 may require appropriate surface preparation, such as polishing, cleaning, etching, or roughening to assure acceptable contamination removal and/or surface finish. For example, it may be advantageous to roughen a copper/polymer base by plasma cleaning, or to smoothen a ceramic, plastic, or metal base by polishing. For illustration purposes, base 12 is a planarized alumina ceramic. A trilayer 13 is then evaporated on base 12. The trilayer consists of 500 angstroms chromium 14 on base 12, 5 microns copper 16 on the chromium, and 500 angstroms titanium 18 on the copper. Chromium 14 provides adhesion, copper 16 provides a first set of horizontal electrically conductive lines, and titanium 18 provides protection for the copper against oxidation and corrosion. More generally, tantalum, chromium and titanium each make useful adhesive or protective layer metals. Evaporation is preferred over sputtering which, due to the relatively slow deposition rate (e.g., 200-300 angstroms per minute), normally employs a subsequent plating step to form the bulk of the copper 16.

Figure 2:
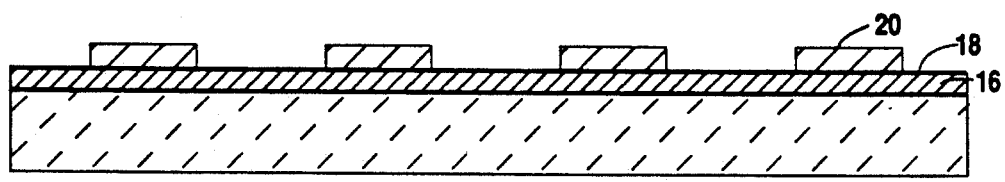
FIG. 2 shows a fragmentary elevational view in cross-section of a patterned resist mask on the metal.

With reference now to FIG. 2, a layer of photoresist 20 is deposited on titanium 18 and patterned as is conventional.

Figure 3:
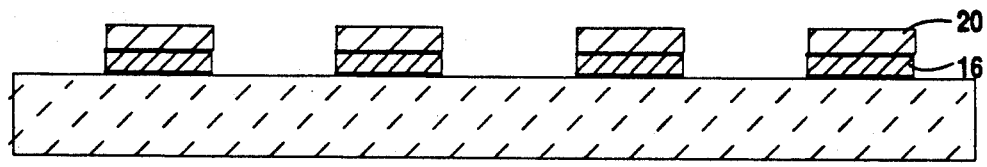
FIG. 3 shows a fragmentary elevational view in cross-section of the exposed metal etched to form first metal lines.

In FIG. 3 the exposed trilayer 13 is wet etched by suitable chemical etchants. The etchants may also undercut (not shown) the edges of trilayer 13 beneath resist 20. In fact, isotropic wet etching is unsuitable where the desired metal pattern has a high aspect ratio and a very high pitch. Instead, the conductive lines could be pattern plated either electrolytically or electrolessly. Nonetheless, disposing the first metal lines on the base by wet etching a blanket layer, as illustrated hereafter, normally requires fewer process steps than pattern plating.

Figure 4:
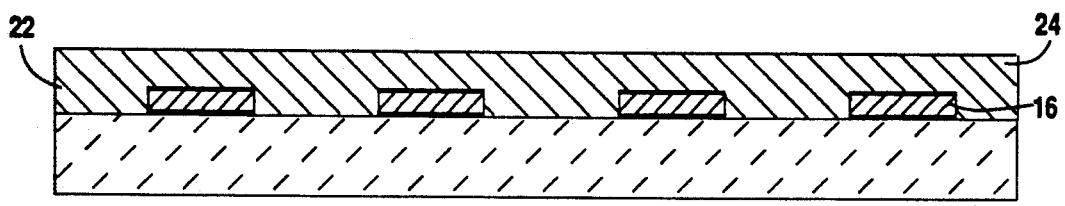
FIG. 4 shows a fragmentary elevational view in cross-section of a dielectric deposited over the first metal lines to form a first layer.

Referring now to FIG. 4, resist 20 is stripped and a first dielectric is disposed or coated over the first metal lines. Suitable dielectrics include inorganic materials such as silicon oxide, aluminum oxide and aluminum nitride. Inorganic dielectrics are particularly well suited for aluminum lines. The dielectric can also be an organic material such as a polymer. Preferably, a dielectric layer of polymer is provided from plasma polymerization of a silicone monomer or some hydrocarbon-rich monomer. These monomers can be subjected to plasma conditions and polymerized to form thin polymer films with low dielectric constants (e.g., 2.1) and good adhesion to copper. Suitable monomer dielectrics include benzocyclobutene (BCB), divinyl dimethylsiloxane, dihydrodimethyliloxane and their admixtures. The plasma can have not only a monomer fed into the chamber, but also a carrier gas such as argon, helium or neon. Another reactive gas such as oxygen, nitrogen, methane, carbon monoxide and carbon dioxide can also be added to modify the film properties. Graded thin film properties can also be generated by changing the composition/type of the gases/vapors fed into the plasma chamber as a function of time. This enables one or both sides of the film to have good adhesion to copper while assuring the bulk of the film has good electrical properties. Furthermore, a plasma deposition system can be used as a resist ashing system as well as a polymer etchback to avoid leakage due to chromium diffused into the polymer. Alternatively to plasma polymerization, spin-on polymers such as polyimide can be used but then additional steps such as resist strip and etchback might be necessitated. Furthermore, polyimide has a dielectric constant typically in the range of 3.5 to 3.8. This presents a drawback in comparison to plasma polymerized polymers (2.1) since smaller dielectric constants require smaller interlayer dielectric thickness to maintain a constant characteristic impedance, such as 50 ohms. For illustration purposes, a 12 micron layer of plasma deposited polymer 24 is disposed over ceramic 12 and copper lines 16. The top surface of polymer 24 may be planarized by polishing, however, polymer 24 may already be fairly planar due to its larger thickness (12 microns) than copper lines 16 (5 microns). This provides a first signal layer 22 which contains copper lines 16 beneath polymer 24.

Figure 5:
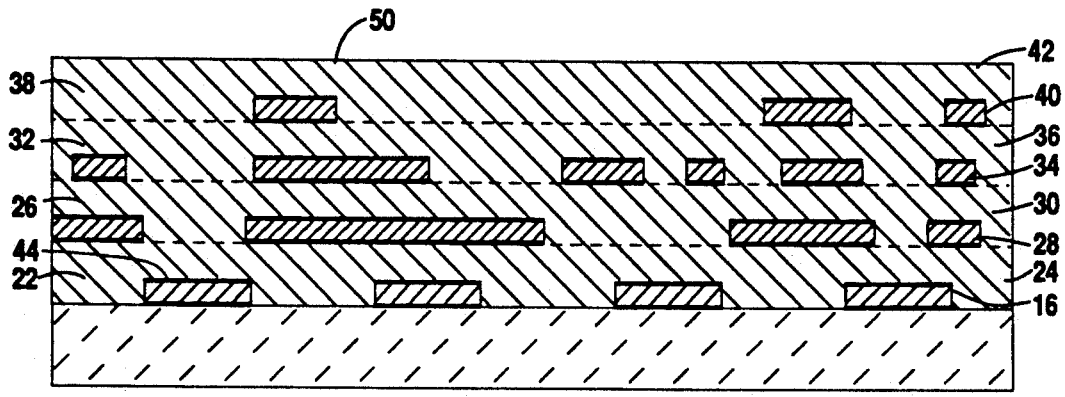
FIG. 5 shows a fragmentary elevational view in cross-section of a multilayer substrate containing three additional layers stacked on the first layer, wherein a portion of a metal line in each layer is uncovered by any other metal lines.

With reference now to FIG. 5, the aforementioned steps are repeated to fabricate three additional signal layers on substrate 10. As may be seen, second layer 26 containing copper lines 28 and polymer 30 is deposited on polymer 24, third layer 32 containing copper lines 34 and polymer 36 is deposited on polymer 30, and fourth layer 38 containing copper lines 40 and polymer 42 is deposited on polymer 36. Copper lines 28, 34 and 40 are preferably sandwiched in metal trilayers similar to trilayer 13 for copper lines 16. It is critical to note, however, that at least a portion of copper lines 16, 28, 34 and 40 is not covered by any copper line in a higher layer. In other words, portion 44 of copper lines 16 is not beneath any of copper lines 28, 34 or 40, portion 46 of copper lines 28 is not beneath any of copper lines 34 or 40, portion 48 of copper lines 34 is not beneath any copper lines 40, and no copper lines are above copper lines 40. This arrangement of conductive lines is at the heart of the present invention. It assures that vertical via holes originating at the top dielectric surface 50 and formed solely through dielectric material can reach and expose conductive lines in each layer. That is, a portion of a conductive line in each layer is not "blocked" from the upper substrate surface by any conductive lines in higher layers. As a result, every via hole in substrate 10 can be formed after the uppermost layer is deposited. There is no need to form vias layer-by-layer as the layers are stacked.

The next step of the present invention is to form the via holes from the top dielectric surface to conductive lines within each layer in a single step. It is essential to the present invention that the source which attacks the dielectric to form or etch the via holes is incapable of altering the conductive lines to any significant degree. In other words, the dielectric and conductive lines must have sufficiently different physical properties to assure that the conductive lines act as a barrier or etch stop to whatever is forming the via holes in the dielectric. This assures that the via holes extend downward vertically to expose the first underlying conductive line, but no further. Numerous approaches for forming or etching via holes in dielectrics are known to those having skill in the art. Several will be described.

Figure 6:
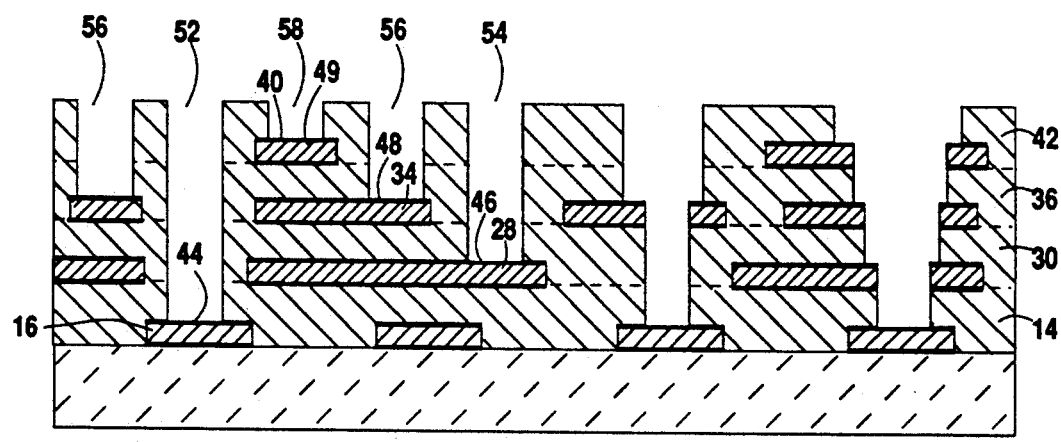
FIG. 6 shows a fragmentary elevational view in cross-section of via holes formed above the exposed portions of the metal lines in each layer in accordance with a laser drilling embodiment.

Referring now to FIG. 6, a plurality of vertical through-holes or via holes are formed through dielectric layers of the substrate. "Vertical" via holes, as used herein, includes via holes with not only 90 degree sidewalls, but also substantially vertical sidewalls which taper slightly inwardly, such as 2° to 5°, thereby causing the via hole diameter to decrease slightly with increasing depth. Via holes "through" a dielectric layer, as used herein, includes not only holes extending from the top to the bottom of a dielectric layer, but also holes extending from the top of a dielectric layer to a copper metal line inside the layer, as will be clear from the context. As may be seen, via holes 52 are formed through polymer layers 42, 36, 30 and 14 to expose portions 44 of copper lines 16. Likewise, via holes 54 are formed through polymer layers 42, 36 and 30 to expose portions 46 of copper lines 28, via holes 56 are formed through polymer layers 42 and 36 to expose portions 48 of copper lines 34, and via holes 58 are formed through polymer layer 42 to expose portions 49 of copper lines 40. For illustration purposes, the via holes are anisotropically formed one at a time by laser drilling, such as with a $CO_2$ or Nd:YAG laser, preferably an excimer laser. The use of an excimer laser to remove selected regions of materials by photoablation is well known in the art. This is termed "ablative photodecomposition" (APD) and requires high powered pulsed laser beams. For instance, U.S. Pat. No. 4,414,059 describes an APD process in which ultraviolet radiation of wavelengths less than 220 nm cause fragmentation of resist polymer chains and the immediate escape of the fragmented portions from the resist layer. In effect, the incident energy is transferred to kinetic energy in rapid and large amounts of bond breaking whereby polymer chains are fragmented and explode-off as volatile by-products. The copper lines, however, must not ablate or be otherwise deformed by the laser beam to any significant degree.

Figure 6A:
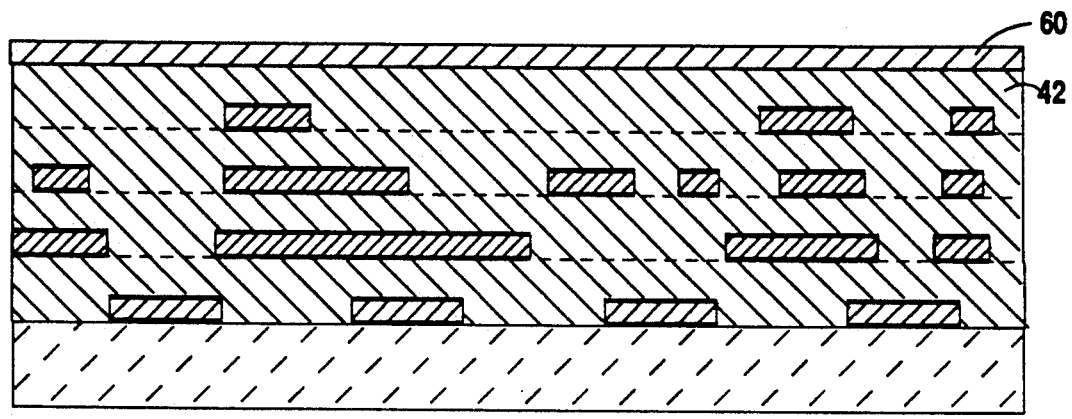
FIGS. 6A–6F show fragmentary elevational views in cross-section of via holes formed above the exposed portions of the metal lines in each layer in accordance with a reactive ion etching through a patterned mask embodiment.
Figure 6B:
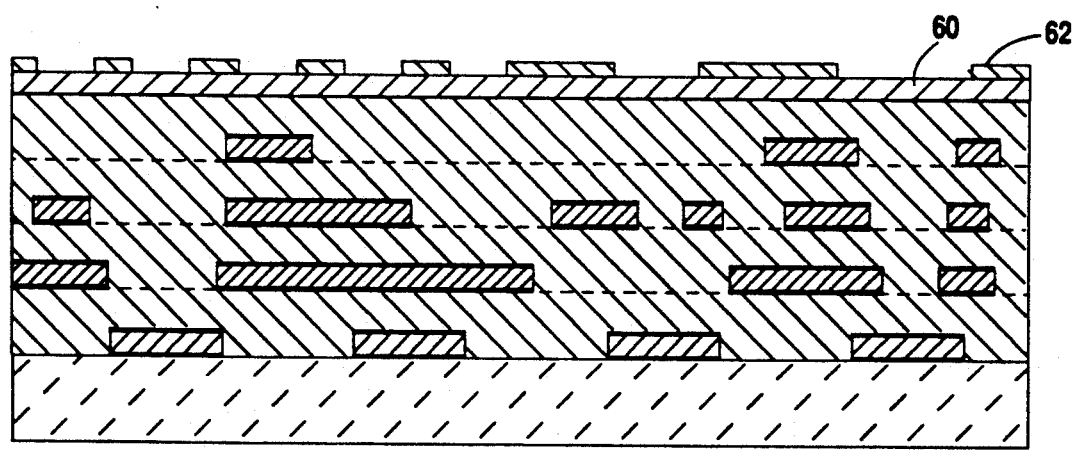
Figure 6C:
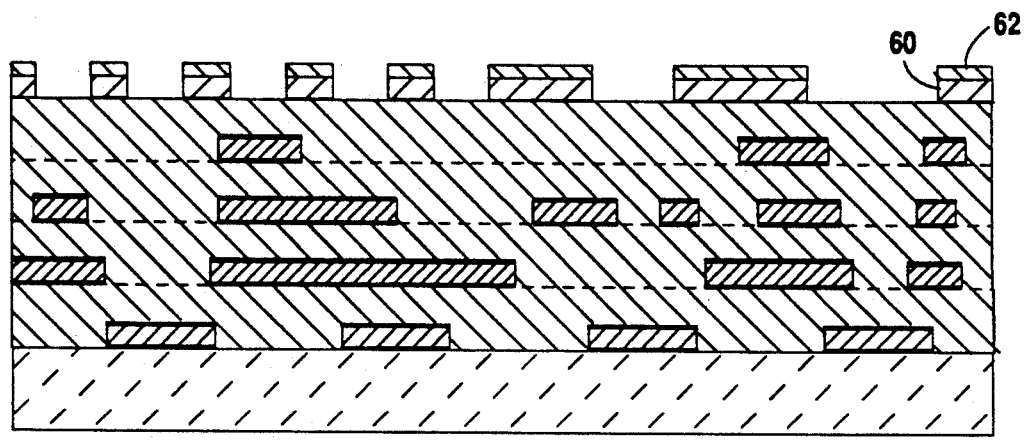
Figure 6D:
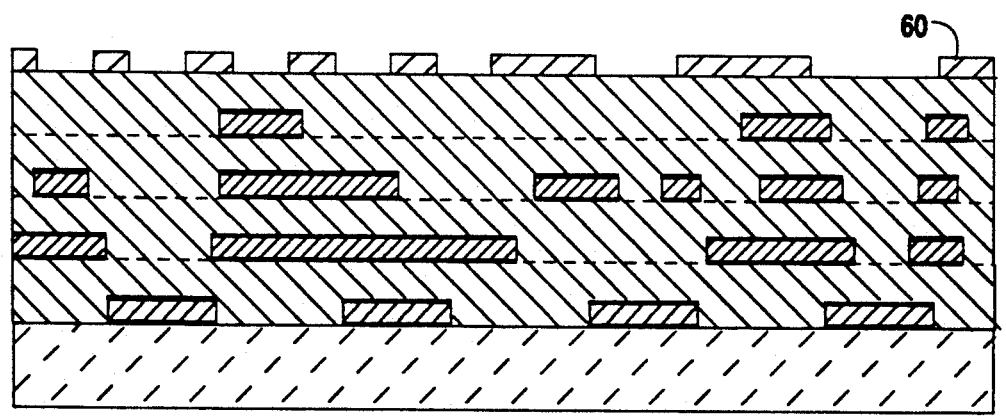
Figure 6E:
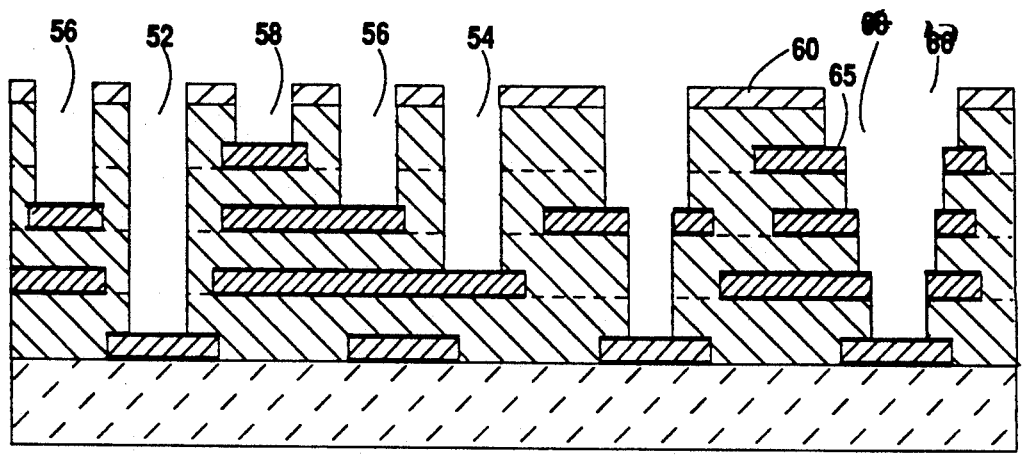
Figure 6F:
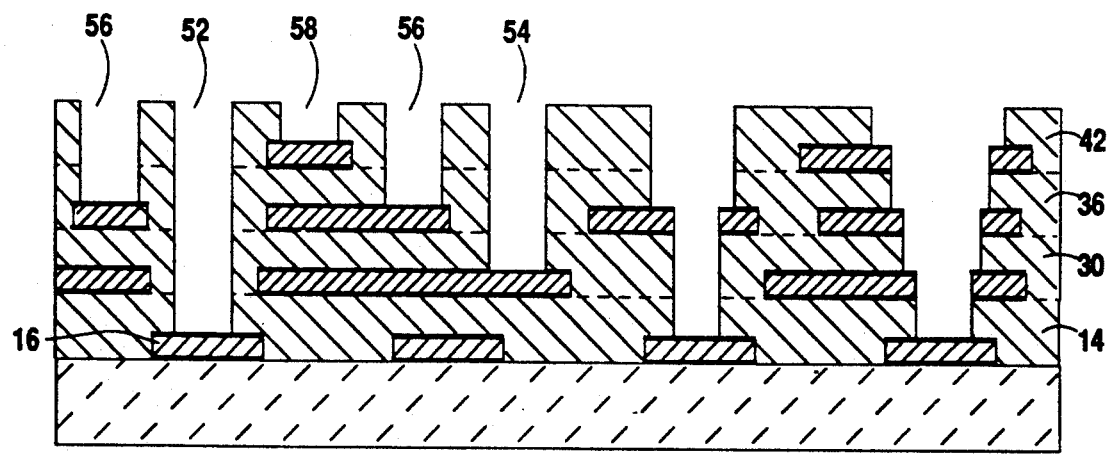

Referring now to FIGS. 6A-6F, another etching technique for forming the via holes is set forth. An anisotropic (vertical) dry etch is applied through a patterned mask to avoid the isotropic undercutting typical to wet chemical etchants. As seen in FIG. 6A etch mask 60 is seen as a blanket layer of chromium deposited on polymer 42. Suitable metals for the etch mask further include copper, aluminum, chromium and tungsten. A copper etch mask may comprise a trilayer similar to trilayer 13. In FIG. 6B a resist mask 62 is deposited on etch mask 60 and selectively patterned. In FIG. 6C the exposed regions of etch mask 60 are removed by wet chemical etching. In FIG. 6D the photoresist 62 is stripped. In FIG. 6E a dry etch is applied to concurrently form the via holes 52, 54, 56 and 58 in a single etching step. A reactive ion etch is preferred, although plasma etching is also suitable. Whatever dry etch is used must not deform copper lines 16, 28, 34 or 40 to any appreciable degree, but rather must be vertically blocked upon reaching and exposing any copper. It should be noted that a metal line may only partially block the dry etch. For instance, copper line portion 65 is seen to only partially underlay mask opening 66 and thus unblocked region 68 under mask opening 66 is etched below portion 65. Finally, in FIG. 6F etch mask 60 is stripped.

The use of a patterned mask is not limited to dry etching. For instance (not shown), the substrate could be exposed to ultraviolet radiation from a scanning excimer laser through a metal mask, such as chromium on glass, with openings in the desired locations. This presents a tradeoff between a using patterned mask and laser drilling the vias one-by-one: with a patterned mask the via holes are formed concurrently instead of one at a time, greatly increasing throughput, however, several additional processing steps are required to utilize the mask. The choice may depend on the number of via holes desired. But in the event an inorganic dielectric is used, reactive ion etching would be preferred over laser drilling.

Figure 7:
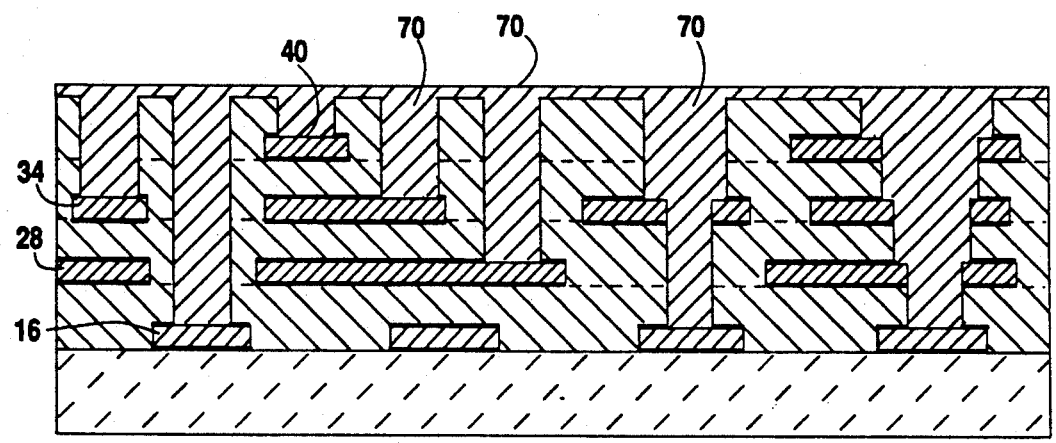
FIG. 7 shows a fragmentary elevational view in cross-section of a conductive via metal deposited into the via holes and over the dielectric.

With reference now to FIG. 7, the via holes can now be filled with an electrically conductive material such as an appropriate metal. Suitable deposition techniques for metals include electrolytic, electroless, and most preferably chemical vapor deposition of copper, tungsten, nickel or nickel alloys. Chemical vapor deposition is particularly well suited for simultaneously filling via holes with similar diameters and high aspect ratios. Using electrolytic or electroless deposition, the via holes with shorter depths may fill sooner than deeper via holes, necessitating the additional step of planarizing the surface. However, filling the via holes with a thin layer of heavily biased sputtered titanium/copper/chromium, or chemical vapor deposited titanium and copper, may provide an electrolytic initiator throughout the via holes, equalize the plating times, and reduce the need for planarization. Furthermore, plating tends to have greater throughput than chemical vapor deposition. Returning to the example, any protective titanium above copper lines 16, 28, 34 and 40 is removed. Then a blanket layer of copper via metal 70 is deposited by low pressure chemical vapor deposition into via holes 52, 54, 56 and 58. Although the via holes are shown completely filled, if desired metal 70 may only partially fill the via holes.

Figure 8:
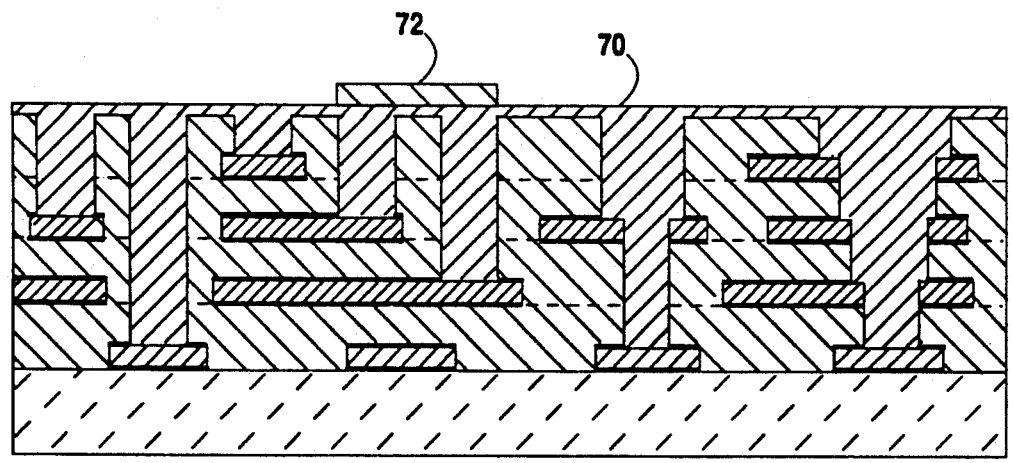
FIG. 8 shows a fragmentary elevational view in cross-section of a patterned resist mask over the substrate.

Referring now to FIG. 8, a second photoresist mask 72 is patterned over copper 70.

Figure 9:
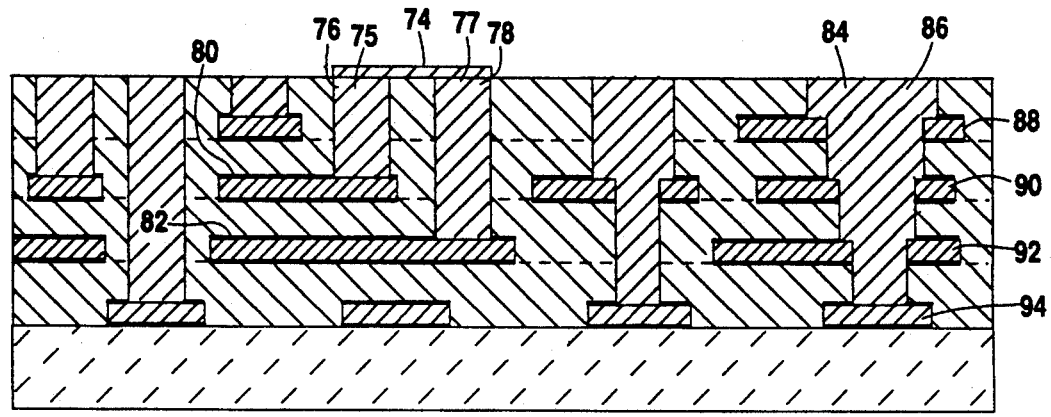
FIG. 9 shows a fragmentary elevational view in cross-section of patterned routing metallization over the substrate.

With reference now to FIG. 9, the exposed copper 70 above polymer 42 is wet etched and second mask 72 is stripped. The unetched copper 70 above polymer 42 serves as routing metal 74. It is important to note that conductive paths can be formed between copper lines 16, 28, 34 and 40 in two ways. First, the routing metal 74 above top dielectric layer 42 can connect metal in separate via holes which extend to conductive lines in different signal layers. For instance, routing metal 74 connects copper 75 in via hole 76 to copper 77 in via hole 78, thereby forming a continuous conductive metal path between copper lines 80 and 82. Secondly, the conductive lines can be designed so that a conductive line in an upper level is exposed by and blocks only a portion of a via hole, and the unblocked portion of the via hole vertically extends downward to expose another conductive line in a lower layer. Filling the via hole with metal thus provides a conductive path between the exposed portions of the conductive lines on the upper and lower levels. This allows connections to be made between signal layers without additional metal 74 as previously described, and therefore may save space and allow custom designs to be more efficient. For example, metal 84 in via hole 86 provides a conduction path between copper lines 88, 90, 92 and 94. More generally, a preferred wiring configuration for customizable high density copper/polyimide substrates is disclosed in European Patent Application 88308996.3 entitled "Customizable Circuitry."

Those skilled in the art will recognize that many other processes are well suited to acheive the results from FIGS. 8 and 9. For example, metal 70 above upper polymer layer 42 can be planarized and removed by polishing, and then routing metal 74 can be electrolessly deposited on and between copper via metals 75 and 77.

Figure 10:
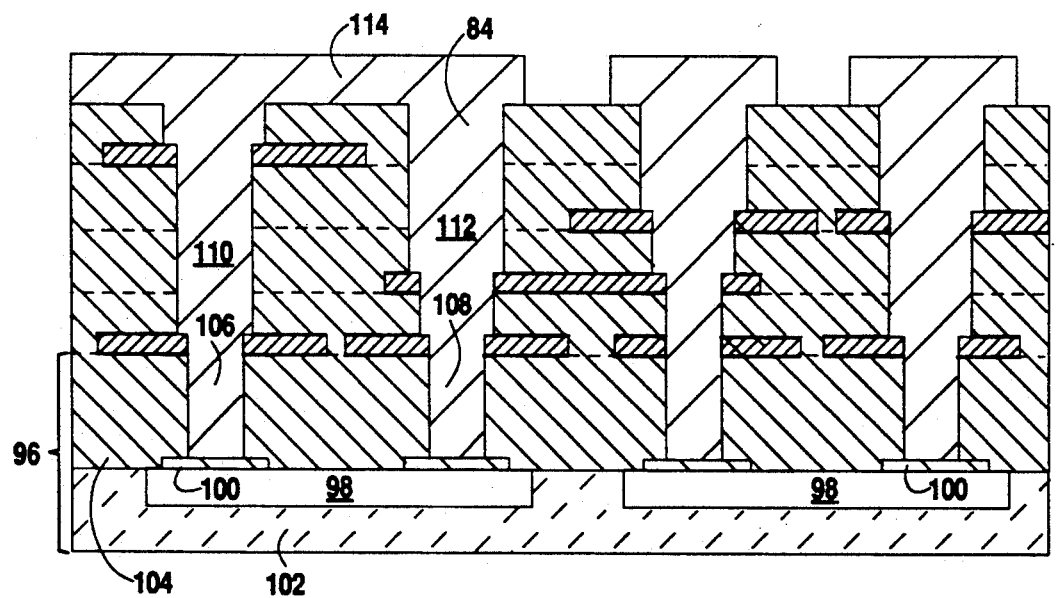
FIG. 10 shows a fragmentary elevational view in cross-section of another multilayer structure which includes an integrated circuit chip in the base.

Referring now to FIG. 10, it is important to note that the present invention can also provide via holes for interconnecting various terminals of electronic components. As may be seen in another multilayer structure, base 96 includes integrated circuit chips 98 with aluminum bonding pads 100 in alumina frame 102. Chips 98 and frame 102 are coated by kapton layer 104. Pads 106 and 108 are connected to metal deposited in via holes and linked by a conductive path comprising via metals 110, 112 and reroute metal 114.

The present invention, therefore, is well adapted to carry out the objects and attain the ends and advantages mentioned, as well as others inherent therein. While presently preferred embodiments of the present invention have been described for the purpose of disclosure, numerous other changes and modifications in the details of construction, arrangement of parts and steps of processing can be carried out without departing from the spirit of the invention which is intended to be limited only by the scope of the appended claims.

What is claimed is:

1. A method of forming every via hole in a multilevel substrate in a single step, comprising:
    disposing over a base a first layer comprising first metal lines beneath a first dielectric;
    disposing over the first layer a second layer comprising second metal lines beneath a second dielectric such that portions of selected first metal lines are not beneath any second metal line; and then
    forming a plurality of via holes by applying an etch, the dielectrics and metal lines having sufficiently different physical properties to assure that the etch attacks the dielectrics but is blocked by the metal lines without deforming the metal lines to any significant degree whereby the metal lines provide a barrier to the etch, so as to form the via holes wherein some via holes extend through the second dielectric and terminate at the top surfaces of selected second metal lines while other via holes extend through the first and second dielectrics and terminate at the top surfaces of said portions of the first metal lines, thereby forming each of the via holes in the substrate in a single step.

2. The method of claim 1 wherein the via hole sidewalls are vertical and the first and second metal lines are horizontal.

3. The method of claim 1 wherein the first and second dielectrics are inorganic materials.

4. The method of claim 3 wherein the inorganic material is selected from the group consisting of silicon oxide, aluminum oxide and aluminum nitride.

5. The method of claim 1 wherein the first and second dielectrics are polymers.

6. The method of claim 5 wherein the polymers are plasma deposited.

7. The method of claim 6 wherein the polymers are polymerized from a material comprising a monomer.

8. The method of claim 1 wherein the first and second metal lines are selected from the group consisting of copper and tungsten.

9. The method of claim 1 wherein the first and second metal lines are copper.

10. The method of claim 1, further comprising
    depositing a first adhesive metal layer between the first metal lines and the base, and
    depositing a second adhesive metal layer between the second metal lines and the first dielectric layer.

11. The method of claim 10 wherein the first and second adhesive metals are selected from the group consisting of tantalum, chromium and titanium.

12. The method of claim 1, further comprising
    depositing a first protective metal layer between the first metal lines and the first dielectric layer, and
    depositing a second protective metal layer between the second metal lines and the second dielectric layer.

13. The method of claim 12 wherein the first and second protective metals are selected from the group consisting of tantalum, chromium and titanium.

14. The method of claim 1 wherein the via holes are formed anisotropically.

15. The method of claim 14 wherein forming the via holes further comprises,
    providing a patterned mask over the second dielectric,
    applying a dry etch through openings in the mask to form the via holes, and
    stripping the mask.

16. The method of claim 15, wherein providing the patterned mask further comprises,
    depositing a metal layer over the second dielectric,
    depositing a resist mask on and selectively exposing the metal layer, and
    wet chemical etching the exposed metal layer to form the patterned mask.

17. The method of claim 16 wherein the patterned mask is selected from the group consisting of chromium, aluminum, copper and tungsten.

18. The method of claim 15 wherein the dry etch is a reactive ion etch.

19. The method of claim 15 wherein the dry etch is a plasma etch.

20. The method of claim 14 wherein the via holes are formed by laser drilling.

21. The method of claim 20 wherein the laser is an excimer laser.

22. The method of claim 1, further comprising depositing a conductive via metal in the via holes.

23. The method of claim 22 wherein the via metal completely fills the via holes.

24. The method of claim 22 wherein the via metal is electrolessly deposited.

25. The method of claim 24 wherein prior to electroless deposition an initiator is deposited in the via holes by one of chemical vapor deposition or sputtering.

26. The method of claim 22 wherein the via metal is deposited by one of chemical vapor deposition.

27. The method of claim 22 wherein the via metal is selected from the group consisting of copper, tungsten, nickel and nickel alloys.

28. The method of claim 22 wherein via metal in a single via hole electrically connects a first metal line in said single via hole to a second metal line in said single via hole, said single via hole further comprising a vertical portion above but not below the second metal line.

29. The method of claim 22, further including
depositing a routing metal on conductive via metal in separate via holes and on the second dielectric to form a continuous metal link between the via metal in the separate via holes, thereby electrically connecting metal lines in the separate via holes.

30. The method of claim 1 wherein the base comprises an integrated circuit chip.

31. The method of claim 30, wherein
the base comprises a plurality of integrated circuit chips and a base dielectric positioned between the chips and the first metal lines,
the integrated circuit chips comprise conductive pads,
the base dielectric and the pads have sufficiently different physical properties to assure that the etch attacks the base dielectric but is blocked by the pads without deforming the pads to any significant degree whereby the pads provide a barrier to the etch,
selected pads are not beneath any first or second metal line, and
selected via holes extend through the base, first and second dielectrics and terminates at the top surfaces of the selected pads.

32. The metal of claim 31, further comprising depositing a conductive via metal in the via holes.

33. The method of claim 32 wherein a first pad on a first integrated circuit chip is connected to a second pad on a second integrated circuit chip by a continuous conductive path comprising via metal in a first via hole deposited on the first pad, a second metal line, and via metal in a second via hole deposited on the second pad.

34. The method of claim 32 wherein a first pad on a first integrated circuit chip is connected to a second pad on a second integrated circuit chip by a continuous conductive path comprising via metal deposited in a first via hole on the first pad, routing metal deposited on the top surface of the substrate, and via metal in a second via hole deposited on the second pad.

35. The method of claim 34 wherein the continuous conductive path consists of the via metal in the first via hole deposited on the first pad, the routing metal deposited on the top surface of the substrate, and the via metal in the second via hole deposited on the second pad.

36. The method of claim 32, wherein
the first metal lines are spaced parallel lines,
the second metal lines are spaced parallel lines approximately orthogonal to the first metal lines, and
a first pad on a first integrated circuit chip is connected to a second pad on a second integrated circuit chip by a continuous conductive path comprising via metal in a first via hole deposited on the first pad, a first metal line connected to the via metal in the first via hole, via metal in a second via hole connected to the first metal line, a second metal line connected to the via metal in the second via hole, and via metal in a third via hole connected to the second metal line and deposited on the second pad.

37. The method of claim 36 wherein the pads are aluminum, the metal lines are copper, and the dielectrics are a polymer.

38. The method of claim 37 wherein the base dielectric is kapton.

39. The method of claim 38 wherein the base is an alumina frame.

40. The method of claim 30 wherein conductive pads on the integrated circuit chip are exposed by via holes.

41. A method of forming conductive vias in a multi-level substrate, including forming every via hole to receive a conductor in a single step, comprising the following steps in the sequence set forth:
disposing a first layer comprising first horizontal copper lines covered by a first polymer on a base;
disposing a second layer comprising second horizontal copper lines covered by a second polymer on the first layer such that a portion of each first copper line is not beneath any second copper line;
forming a plurality of vertical via holes in the top of the second polymer by applying an etch, the polymers and copper lines having sufficiently different physical properties to assure that the etch attacks the polymers but is blocked by the copper lines without deforming the copper lines to any significant degree whereby the copper lines provide a barrier to the etch, so as to form all the via holes in the substrate in a single etch step wherein some via holes extend through only the second polymer and terminate at the top surfaces of the second copper lines while other via holes extend through both the first and second polymers and terminate at the top surfaces of said portions of the first copper lines, thereby exposing both the first and second copper lines; and
depositing a conductive material in all the via holes to form conductive vias from the first and second copper lines to the top of the second polymer.

42. The method of claim 41 wherein the via holes are formed individually by laser drilling.

43. The method of claim 41 wherein the via holes are formed concurrently by anisotropic dry etching.

44. The method of claim 41 wherein the first and second copper lines are patterned by wet etching.

45. The method of claim 41 wherein said first metal lines are pads on an integrated circuit chip.

46. The method of claim 41, further including mounting a plurality of integrated circuit chips on the surface of the substrate after depositing the conductive material in the via holes.

47. A method of forming every via hole in a multi-level substrate in a single step, comprising the following steps in the sequence set forth:
depositing a plurality of first metal lines on a base;
depositing a first dielectric layer over the first metal lines;

depositing a plurality of second metal lines on the first dielectric layer such that selected first metal lines comprise uncovered portions without any second metal line directly above;

depositing a second dielectric layer over the second metal lines; and then forming via holes by applying an etch, the dielectrics and metal lines having sufficiently different physical properties to assure that the etch attacks the dielectrics but is blocked by the metal lines without deforming the metal lines to any significant degree whereby the metal lines provide a barrier to the etch thereby forming via holes at the top of the second dielectric which extend through the second dielectric and terminate at the top surfaces of selected second metal lines concurrently with forming other via holes which extend through the second dielectric and the first dielectric and terminate at the top surfaces of the uncovered portions of the first metal lines, thereby forming each of the via holes in the substrate with a single etch in a single step.

48. A method of forming every via hole in a multilevel substrate in a single step, comprising:

depositing a plurality of first metal lines on a base;

depositing a first dielectric layer over the first metal lines and base;

depositing a plurality of second metal lines on the first dielectric layer such that each first metal line comprises an uncovered portion without any second metal line above;

depositing a second dielectric layer over the second metal lines and the first dielectric layer;

depositing a plurality of third metal lines on the second dielectric layer such that each second metal line comprises an uncovered portion without any third metal line above and the uncovered portions of the first metal lines are not covered by any third metal line;

depositing a third dielectric layer over the third metal lines and the second dielectric layer;

depositing a plurality of fourth metal lines on the third dielectric layer such that each third metal line comprises an uncovered portion without any fourth metal line above, and the uncovered portions of the second and first metal lines are not covered by any fourth metal line;

depositing a fourth dielectric layer over the fourth metal lines and the third dielectric layer; and forming each of the via holes in the substrate in a single step by applying an etch, the dielectrics and metal lines having sufficiently different physical properties to assure that the etch attacks the dielectrics but is blocked by the metal lines without deforming the metal lines to any significant degree whereby the metal lines provide a barrier to the etch, so that the via holes extend from the top of the fourth dielectric layer to the top surfaces of the fourth metal lines and the top surfaces of uncovered portions of the third, second and first metal lines wherein separate via holes extend to separate metal lines.

49. A method of forming every via hole in a multilevel substrate in a single step, comprising the following steps in the sequence set forth:

depositing a plurality of first horizontal copper lines on a planar base;

depositing a first planar dielectric layer over the first copper lines and the base;

depositing a plurality of second horizontal copper lines, approximately orthogonal to the first copper lines, on the first dielectric layer such that portions of each first copper line are not directly below any second copper line;

depositing a second planar dielectric layer over the second copper lines and the first dielectric layer; and forming vertical via holes by applying an etch, the dielectrics and copper lines having sufficiently different physical properties to assure that the etch attacks the dielectrics but is blocked by the copper lines whereby the copper lines provide an etch stop, with some vertical via holes extending through only the second dielectric to expose the top surfaces of second copper lines and other vertical via holes extending through both the second dielectric and the first dielectric to expose the top surfaces of said portions of the first copper lines without deforming any copper lines, thereby forming each of the via holes in the substrate in a single step.

* * * * *

UNITED STATES PATENT AND TRADEMARK OFFICE
CERTIFICATE OF CORRECTION

PATENT NO. : 5,227,013
DATED : July 13, 1993
INVENTOR(S) : Nalin Kumar

It is certified that error appears in the above-indentified patent and that said Letters Patent is hereby corrected as shown below:

Column 9, line 43, change "terminates" to -- terminate --.

Column 11, line 13, insert -- , -- after "etch".

Signed and Sealed this

Fifteenth Day of March, 1994

Attest:

BRUCE LEHMAN

*Attesting Officer*           *Commissioner of Patents and Trademarks*